United States Patent
Granger-Jones

(10) Patent No.: US 11,929,713 B2
(45) Date of Patent: Mar. 12, 2024

(54) MAXIMUM VOLTAGE DETECTION IN A POWER MANAGEMENT CIRCUIT

(71) Applicant: Qorvo US, Inc., Greensboro, NC (US)

(72) Inventor: Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 145 days.

(21) Appl. No.: 17/406,550

(22) Filed: Aug. 19, 2021

(65) Prior Publication Data

US 2022/0115987 A1   Apr. 14, 2022

Related U.S. Application Data

(60) Provisional application No. 63/091,721, filed on Oct. 14, 2020, provisional application No. 63/091,709, filed on Oct. 14, 2020.

(51) Int. Cl.
*H03F 1/02* (2006.01)
*G01R 19/04* (2006.01)
(Continued)

(52) U.S. Cl.
CPC .......... *H03F 1/0222* (2013.01); *G01R 19/04* (2013.01); *H03F 1/02* (2013.01); *H03F 3/195* (2013.01);
(Continued)

(58) Field of Classification Search
CPC .......... H03F 1/0222; H03F 1/02; H03F 3/195; H03F 3/20; H03F 3/245; H03F 2200/102;
(Continued)

(56) References Cited

U.S. PATENT DOCUMENTS

| 4,477,848 A | 10/1984 | McWhirter et al. |
| 4,827,458 A | 5/1989 | D'Alayer de Costemore D'Arc |

(Continued)

FOREIGN PATENT DOCUMENTS

WO   WO-2012050257 A2 *   4/2012   ........... H03F 1/3229

OTHER PUBLICATIONS

Non-Final Office Action for U.S. Appl. No. 17/363,522, dated Jul. 11, 2022, 7 pages.

(Continued)

*Primary Examiner* — Steven L Yeninas
*Assistant Examiner* — Dilara Sultana
(74) *Attorney, Agent, or Firm* — Withrow & Terranova, P.L.L.C.

(57) ABSTRACT

Maximum voltage detection in a power management circuit is provided. In embodiments disclosed herein, the power management circuit includes a voltage processing circuit configured to receive a first time-variant target voltage having a first group delay relative to a time-variant target voltage and a second time-variant target voltage having a second group delay relative to the time-variant target voltage. The voltage processing circuit includes a maximum signal detector circuit configured to generate a windowed time-variant target voltage that is higher than or equal to a highest one of the first time-variant target voltage and the second time-variant target voltage in a group delay tolerance window(s) defined by the first group delay and the second group delay. In this regard, the windowed time-variant target voltage can tolerate a certain amount of group delay within the group delay tolerance window(s).

20 Claims, 11 Drawing Sheets

(51) Int. Cl.
*H03F 3/195* (2006.01)
*H03F 3/20* (2006.01)
*H03F 3/24* (2006.01)
*H03K 5/13* (2014.01)

(52) U.S. Cl.
CPC ............... *H03F 3/20* (2013.01); *H03F 3/245* (2013.01); *H03K 5/13* (2013.01); *H03F 2200/102* (2013.01); *H03F 2200/451* (2013.01)

(58) Field of Classification Search
CPC ............ H03F 2200/451; H03F 1/0227; H03F 3/45475; G01R 19/04; G01R 19/16538; H03K 5/13
See application file for complete search history.

(56) References Cited

U.S. PATENT DOCUMENTS

| | | | |
|---|---|---|---|
| 5,304,864 | A | 4/1994 | Hong et al. |
| 8,665,016 | B2 * | 3/2014 | Chowdhury .......... H03F 1/0222 330/136 |
| 9,445,371 | B2 | 9/2016 | Khesbak et al. |
| 9,748,912 | B2 | 8/2017 | Choi et al. |
| 10,181,826 | B2 | 1/2019 | Khlat et al. |
| 10,516,368 | B2 | 12/2019 | Balteanu et al. |
| 10,530,311 | B2 | 1/2020 | Khlat et al. |
| 10,615,757 | B2 | 4/2020 | Balteanu et al. |
| 10,985,703 | B2 | 4/2021 | Balteanu et al. |
| 10,985,711 | B2 | 4/2021 | Balteanu et al. |
| 11,303,255 | B2 | 4/2022 | Khesbak et al. |
| 2008/0242246 | A1 * | 10/2008 | Minnis .................. H03F 1/0227 455/127.1 |
| 2010/0271123 | A1 * | 10/2010 | Forrester ............... H03F 1/3247 330/149 |
| 2012/0313701 | A1 | 12/2012 | Khlat et al. |
| 2014/0184335 | A1 * | 7/2014 | Nobbe .................. H03F 1/3282 330/296 |
| 2016/0050629 | A1 | 2/2016 | Khesbak et al. |
| 2016/0099687 | A1 | 4/2016 | Khlat |
| 2016/0118941 | A1 * | 4/2016 | Wang ........................ H03F 3/21 330/291 |
| 2017/0170838 | A1 * | 6/2017 | Pagnanelli .............. H04L 7/005 |
| 2017/0310398 | A1 * | 10/2017 | Masuda .................. G06F 13/36 |
| 2017/0359029 | A1 * | 12/2017 | Nobbe .................. H03F 1/0227 |
| 2018/0076772 | A1 | 3/2018 | Khesbak et al. |
| 2019/0109613 | A1 * | 4/2019 | Khlat .................... H03F 1/0233 |
| 2020/0177131 | A1 * | 6/2020 | Khlat ........................ H03F 1/32 |
| 2022/0052646 | A1 | 2/2022 | Khlat |
| 2022/0052647 | A1 | 2/2022 | Khlat et al. |
| 2022/0052648 | A1 | 2/2022 | Khlat |
| 2022/0052649 | A1 | 2/2022 | Retz et al. |
| 2022/0052650 | A1 | 2/2022 | Khlat |
| 2022/0052651 | A1 | 2/2022 | Khlat |
| 2022/0052655 | A1 | 2/2022 | Khlat |
| 2022/0115988 | A1 | 4/2022 | Khlat et al. |
| 2022/0116029 | A1 | 4/2022 | Khlat et al. |
| 2022/0165323 | A1 | 5/2022 | Zhu |
| 2022/0166416 | A1 | 5/2022 | Zhu |

OTHER PUBLICATIONS

1 Non-Final Office Action for U.S. Appl. No. 17/363,522, dated Nov. 25, 2022, 8 pages.

Nakase, et al., "A BiCMOS Wired-OR logic," IEEE Journal of Solid-State Circuits, vol. 30, Issue 6, Jun. 1995, pp. 622-628.

Wan, et al., "Negative Group Delay Theory of a Four-Port RC-Network Feedback Operational Amplifier," IEEE Access, vol. 7, Jun. 24, 2019, pp. 75708-75720.

Williams, Arthur, et al., "Electronic Filter Design Handbook," Third Edition, 1995, McGraw-Hill, Inc. pp. 7.10-7.14.

* cited by examiner

MAXIMUM VOLTAGE DETECTION IN A POWER MANAGEMENT CIRCUIT

RELATED APPLICATIONS

This application claims the benefit of U.S. Provisional Patent Application Ser. No. 63/091,709 filed on Oct. 14, 2020, and U.S. Provisional Patent Application Ser. No. 63/091,721 filed on Oct. 14, 2020, the disclosures of which are incorporated herein by reference in their entireties.

This application is related to U.S. patent application Ser. No. 17/406,530, entitled "POWER MANAGEMENT CIRCUIT OPERABLE WITH GROUP DELAY," the disclosure of which is hereby incorporated herein by reference in its entirety.

FIELD OF THE DISCLOSURE

The technology of the disclosure relates generally to a power management circuit, and particularly an envelope tracking (ET) power management circuit.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

A fifth-generation new radio (5G-NR) wireless communication system is widely regarded as a technological advancement that can achieve significantly higher data throughput, improved coverage range, enhanced signaling efficiency, and reduced latency compared to the existing third-generation (3G) and fourth-generation (4G) communication systems. A 5G-NR mobile communication device usually transmits and receives a radio frequency (RF) signal(s) in a millimeter wave (mmWave) RF spectrum that is typically above 6 GHz. Notably, the RF signal(s) transmitted in the mmWave RF spectrum may be more susceptible to propagation attenuation and interference that can result in substantial reduction in data throughput. To help mitigate propagation attenuation and maintain desirable data throughput, the 5G-NR mobile communication device employs a power amplifier(s) to amplify the RF signal(s) before transmitting in the mmWave RF spectrum.

Envelope tracking (ET) is a power management technique designed to improve operating efficiency of the power amplifier(s). Specifically, the power amplifier(s) is configured to amplify the RF signal(s) based on a time-variant voltage that closely tracks a time-variant power envelope of the RF signal(s). The time-variant voltage is typically generated by a power management circuit in the wireless communication device by first detecting the time-variant power envelop of the RF signal(s) and subsequently mapping the detected time-variant power envelope to a set of target voltage values prestored in a lookup table (LUT). Notably, the inherent processing delay associated with a power management circuit can inadvertently cause the time-variant voltage to lag behind the time-variant power envelope of the RF signal(s). As a result, the peaks of the time-variant voltage may become misaligned with the peaks of the time-variant power envelope, which may cause the power amplifier(s) to clip and distort the RF signal(s). In this regard, it is desirable to ensure that the power management circuit can maintain good alignment between the time-variant voltage and the time-variant power envelope of the RF signal(s).

SUMMARY

Aspects disclosed in the detailed description include maximum voltage detection in a power management circuit. In embodiments disclosed herein, the power management circuit includes a voltage processing circuit configured to receive a first time-variant target voltage having a first group delay relative to a time-variant target voltage and a second time-variant target voltage having a second group delay relative to the time-variant target voltage. The voltage processing circuit includes a maximum signal detector circuit configured to generate a windowed time-variant target voltage that is higher than or equal to a highest one of the first time-variant target voltage and the second time-variant target voltage in a group delay tolerance window(s) defined by the first group delay and the second group delay. In this regard, the windowed time-variant target voltage can tolerate a certain amount of group delay within the group delay tolerance window(s). As a result, the power management circuit can generate a time-variant voltage based on the windowed time-variant target voltage to help a power amplifier to avoid amplitude clipping when amplifying an analog signal.

In one aspect, a maximum signal detector circuit is provided. The maximum signal detector circuit includes a signal selector circuit. The signal selector circuit includes a number of signal inputs each configured to receive a respective one of a number of analog inputs. The signal selector circuit also includes a signal output configured to output a highest one of the analog inputs.

In another aspect, a voltage processing circuit is provided. The voltage processing circuit includes a first group delay circuit configured to receive a time-variant target voltage and generate a first time-variant target voltage having a first group delay relative to the time-variant target voltage. The voltage processing circuit also includes a second group delay circuit configured to receive the time-variant target voltage and generate a second time-variant target voltage having a second group delay relative to the time-variant target voltage. The voltage processing circuit also includes a maximum signal detector circuit. The maximum signal detector circuit includes a signal selector circuit. The signal selector circuit includes a number of signal inputs configured to receive the first time-variant target voltage and the second time-variant target voltage. The signal selector circuit also includes a signal output configured to generate a windowed time-variant target voltage higher than or equal to a highest one of the first time-variant target voltage and the second time-variant target voltage in a number of group delay tolerance windows each defined by the first group delay and the second group delay.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure and, together with the description, serve to explain the principles of the disclosure.

DETAILED DESCRIPTION

Figure 1A:
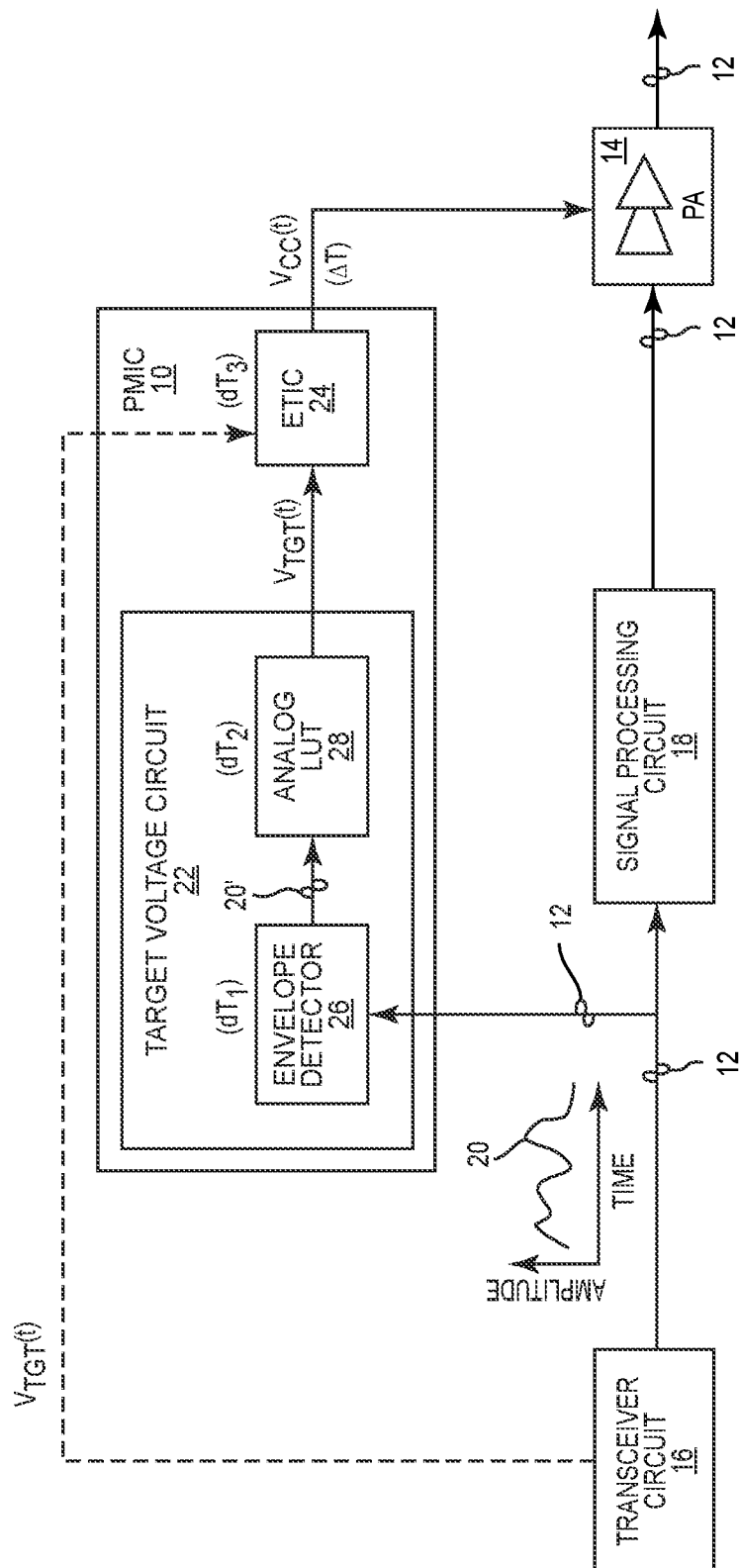
FIG. 1A is a schematic diagram of an exemplary existing power management circuit that may cause amplitude distortion in an analog signal as a result of a group delay associated with a time-variant voltage generated by the existing power management circuit.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Aspects disclosed in the detailed description include maximum voltage detection in a power management circuit. In embodiments disclosed herein, the power management circuit includes a voltage processing circuit configured to receive a first time-variant target voltage having a first group delay relative to a time-variant target voltage and a second time-variant target voltage having a second group delay relative to the time-variant target voltage. The voltage processing circuit includes a maximum signal detector circuit configured to generate a windowed time-variant target voltage that is higher than or equal to a highest one of the first time-variant target voltage and the second time-variant target voltage in a group delay tolerance window(s) defined by the first group delay and the second group delay. In this regard, the windowed time-variant target voltage can tolerate a certain amount of group delay within the group delay tolerance window(s). As a result, the power management circuit can generate a time-variant voltage based on the windowed time-variant target voltage to help a power amplifier to avoid amplitude clipping when amplifying an analog signal.

Figure 1B:
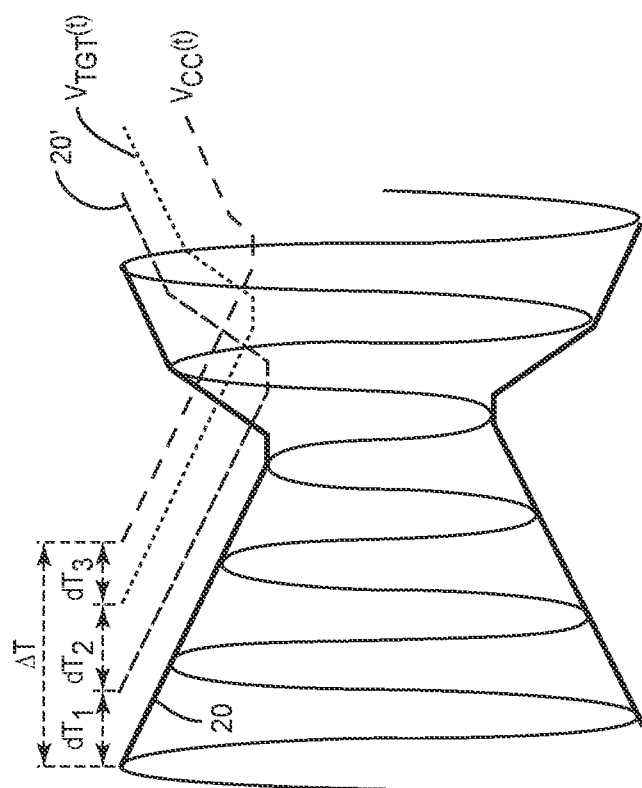
FIG. 1B is a graphic diagram providing an exemplary illustration of the group delay between a time-variant envelope of the analog signal and the time-variant voltage in FIG. 1A.
Figure 1C:
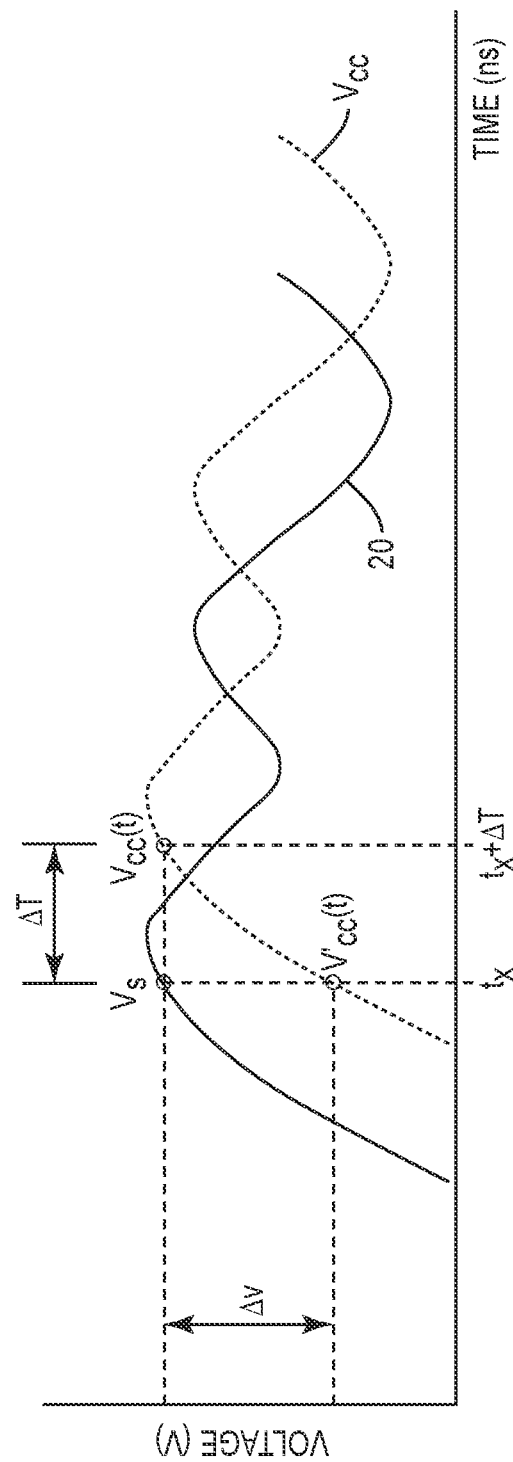
FIG. 1C is a graphic diagram providing an exemplary illustration as to how the group delay can cause amplitude distortion in the analog signal in FIG. 1A.
Figure 2:
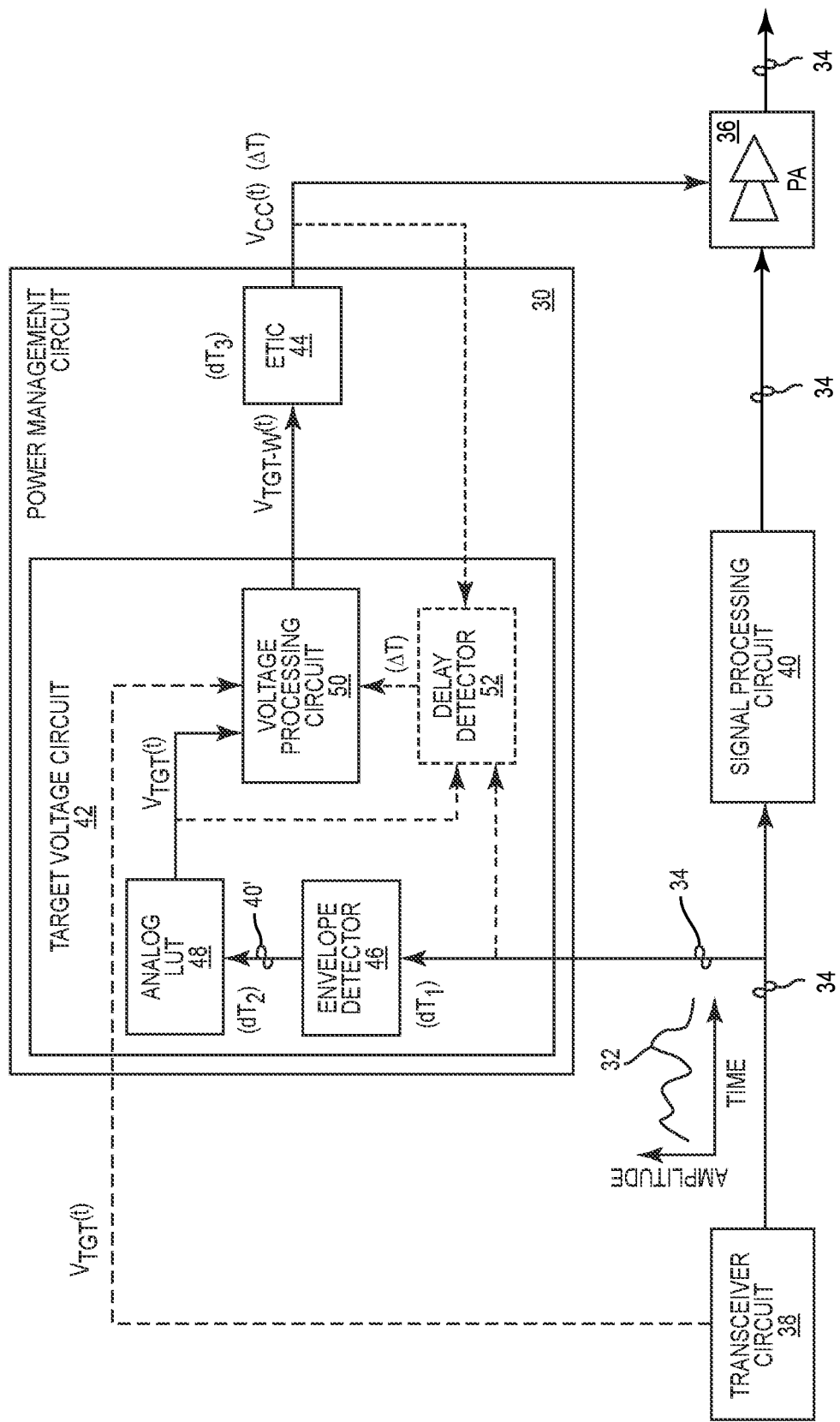
FIG. 2 is a schematic diagram of an exemplary power management circuit configured according to embodiments of the present disclosure to tolerate a group delay between a time-variant voltage and a time-variant envelope of an analog signal.

Before discussing a power management circuit employing a voltage processing circuit of the present disclosure, starting at FIG. 2, a brief overview of an existing power management circuit that may cause amplitude distortion in an analog signal as a result of a group delay associated with a time-variant voltage generated by the existing power management circuit is first provided with reference to FIGS. 1A-1C.

FIG. 1A is a schematic diagram of an exemplary existing power management circuit 10 that may cause amplitude distortion in an analog signal 12 as a result of a group delay $\Delta T$ associated with a time-variant voltage $V_{CC}(t)$ generated by the existing power management circuit 10. The existing power management circuit 10 is configured to provide the time-variant voltage $V_{CC}(t)$ to a power amplifier 14 for amplifying the analog signal 12. The analog signal 12 may be generated by a transceiver circuit 16 and provided to a signal processing circuit 18 in an intermediate frequency (IF). The signal processing circuit 18 may upconvert the analog signal 12 from the IF to a carrier frequency and provide the analog signal 12 to the power amplifier 14 for amplification.

The analog signal 12 is associated with a time-variant envelope 20 that rises and falls over time. Thus, to prevent potential amplitude distortion in the analog signal 12 and ensure higher operating efficiency of the power amplifier 14, it is necessary for the existing power management circuit 10 to generate the time-variant voltage $V_{CC}(t)$ to closely track the time-variant envelope 20.

In other words, the time-variant voltage $V_{CC}(t)$ needs to be aligned with the time-variant envelope 20 as closely as possible. As such, the existing power management circuit 10 is configured to include a target voltage circuit 22 and an envelope tracking (ET) integrated circuit (ETIC) 24. The target voltage circuit 22 includes an envelope detector circuit 26 and an analog lookup table (LUT) circuit 28. The envelope detector circuit 26 is configured to detect the time-variant envelope 20 of the analog signal 12 and provide a detected time-variant envelope 20' to the analog LUT circuit 28. The analog LUT circuit 28 is configured to generate a time-variant target voltage $V_{TGT}(t)$ from the detected time-variant envelope 20' and provide the time-variant target voltage $V_{TGT}(t)$ to the ETIC 24. The ETIC 24, in turn, generates the time-variant voltage $V_{CC}(t)$ based on the time-variant target voltage $V_{TGT}(t)$. Alternatively, the time-variant target voltage $V_{TGT}(t)$ may also be provided to the ETIC 24 by the transceiver circuit 16.

In this regard, since the time-variant target voltage $V_{TGT}(t)$ tracks the detected time-variant envelope 20' and the time-variant voltage $V_{CC}(t)$ tracks the time-variant target voltage $V_{TGT}(t)$, the time-variant voltage $V_{CC}(t)$ will end up rising and falling along with the time-variant envelope 20. Notably, the envelope detector circuit 26, the analog LUT circuit 28, and the ETIC 24 can cause inherent group delays $dT_1$, $dT_2$, and $dT_3$, respectively. As a result, as shown in FIG. 1B, the detected time-variant envelope 20' will lag behind the time-variant envelope 20 associated with the analog signal 12 by the group delay $dT_1$, the time-variant target voltage $V_{TGT}(t)$ will lag behind the detected time-variant envelope 20' by the group delay $dT_2$, and the time-variant voltage $V_{CC}(t)$ will lag behind the time-variant target voltage $V_{TGT}(t)$ by the group delay $dT_3$. As a result of the inherent group delays $dT_1$, $dT_2$, and $dT_3$, the time-variant voltage $V_{CC}(t)$ may be delayed from the time-variant envelope 20 by the group delay $\Delta T$.

FIG. 1B is a graphic diagram providing an exemplary illustration of the group delay $\Delta T$ between the time-variant envelope 20 of the analog signal 12 and the time-variant voltage $V_{CC}(t)$ in FIG. 1A. Common elements between FIGS. 1A and 1B are shown therein with common element numbers and will not be re-described herein.

As shown in FIG. 1B, the detected time-variant envelope 20' is delayed from the time-variant envelope 20 of the analog signal 12 by the group delay $dT_1$, the time-variant target voltage $V_{TGT}(t)$ is delayed from the detected time-variant envelope 20' by the group delay $dT_2$, and the time-variant voltage $V_{CC}(t)$ is delayed from the time-variant target voltage $V_{TGT}(t)$ by the group delay $dT_3$. The group delay $\Delta T$, which refers generally to an actual transit time of a signal (e.g., the time-variant voltage $V_{CC}(t)$) through a device (e.g., the existing power management circuit 10) under test as a function of frequency, can thus include at least the group delay $dT_1$, the group delay $dT_2$, and the group delay $dT_3$. Understandably, the group delay $\Delta T$ can cause timing misalignment between the time-variant voltage $V_{CC}(t)$ and the time-variant envelope 20 at the power amplifier 14 thus causing amplitude distortion (a.k.a., amplitude clipping) in the analog signal 12.

As illustrated in FIG. 1C, the misalignment between the time-variant voltage $V_{CC}(t)$ and the time-variant envelope 20 of the analog signal 12 can cause amplitude distortion in the analog signal 12. FIG. 1C is a graphic diagram providing an exemplary illustration as to how the group delay $\Delta T$ can cause amplitude distortion in the analog signal 12 in FIG. 1A.

If the time-variant envelope 20 and the time-variant voltage $V_{CC}(t)$ are perfectly aligned, an instantaneous amplitude of the analog signal 12 (not shown), which is represented by a voltage $V_S$, would substantially equal the time-variant voltage $V_{CC}(t)$ at time $t_x$. However, as shown in FIG. 1C, the time-variant voltage $V_{CC}(t)$ lags behind the time-variant envelope 20 by the group delay $\Delta T$. As such, at time $t_x$, the power amplifier 14 (not shown) receives a lower voltage $V'_{CC}(t)$, instead of the time-variant voltage $V_{CC}(t)$. In this regard, the time-variant voltage $V_{CC}(t)$ deviates from the time-variant envelope 20 by a voltage differential $\Delta v$ at time $t_x$. Consequently, the power amplifier 14 may clip the analog signal 12 to cause the amplitude distortion. As such, it is desirable to adapt the existing power management circuit 10 to tolerate the group delay $\Delta T$ between the time-variant voltage $V_{CC}$ and the time-variant envelope 20 of the analog signal 12.

In this regard, FIG. 2 is a schematic diagram of an exemplary power management circuit 30 configured according to embodiments of the present disclosure to tolerate a group delay $\Delta T$ between a time-variant voltage $V_{CC}(t)$ and a time-variant envelope 32 of an analog signal 34.

The power management circuit 30 is configured to provide the time-variant voltage $V_{CC}(t)$ to a power amplifier 36 for amplifying the analog signal 34. The analog signal 34 may be generated by a transceiver circuit 38 and provided to a signal processing circuit 40 in the IF. The signal processing circuit 40 may upconvert the analog signal 34 from the IF to a carrier frequency and provide the analog signal 34 to the power amplifier 36 for amplification.

The analog signal 34 is associated with the time-variant envelope 32 that rises and falls over time. Thus, to prevent potential amplitude distortion in the analog signal 34 and ensure higher operating efficiency of the power amplifier 36, it is necessary to generate the time-variant voltage $V_{CC}(t)$ to closely track the time-variant envelope 32.

In this regard, the power management circuit 30 is configured to include a target voltage circuit 42. As discussed below, the target voltage circuit 42 is configured to generate a windowed time-variant target voltage $V_{TGT-W}(t)$ to thereby cause the power management circuit 30 to generate the time-variance voltage $V_{CC}(t)$ with a level of tolerance for the group delay ΔT. More specifically, as illustrated later in FIG. 4, the windowed time-variant target voltage $V_{TGT-W}(t)$ can cause the power management circuit 30 to generate the time-variance voltage $V_{CC}(t)$ that tolerates the group delay ΔT in a number of group delay tolerance windows $WIN_1$, $WIN_2$, $WIN_3$, and so on. As a result, it is possible to avoid amplitude distortion to the analog signal 34 in each of the group delay tolerance windows $WIN_1$, $WIN_2$, $WIN_3$, and so on.

In one embodiment, the target voltage circuit 42 includes an envelope detector circuit 46 and an analog LUT circuit 48. The envelope detector circuit 46 is configured to detect the time-variant envelope 32 of the analog signal 34 and provide a detected time-variant envelope 40' to the analog LUT circuit 48. The analog LUT circuit 48 is configured to generate a time-variant target voltage $V_{TGT}(t)$ based on the detected time-variant envelope 40' of the analog signal 34. Like the envelope detector circuit 26 and the analog LUT circuit 28 in the existing power management circuit 10 of FIG. 1A, the envelope detector circuit 46 and the analog LUT circuit 48 can each cause a certain group delay. As a result, the detected time-variant envelope 40' may be delayed from the time-variant envelope 32 of the analog signal 34 by a group delay $dT_1$ and the time-variant target voltage $V_{TGT}(t)$ may be delayed from the detected time-variant envelope 40' by a group delay $dT_2$. In addition, the ETIC 44 can also incur a certain group delay that may further delay the time-variant voltage $V_{CC}(t)$ from the target voltage $V_{TGT}(t)$ by a group delay $dT_3$. In addition, the time-variant envelope 32 may also experience a certain group delay caused by the signal processing circuit 40. As a result, the time-variant voltage $V_{CC}(t)$ may become misaligned from the time-variant envelope 32 by the group delay ΔT that includes at least the group delays $dT_1$, $dT_2$, and $dT_3$ (ΔT≥$dT_1$+$dT_2$+$dT_3$).

In another embodiment, the target voltage circuit 42 can receive the time-variant target voltage $V_{TGT}(t)$ directly from the transceiver circuit 38. In this regard, the time-variant target voltage $V_{TGT}(t)$ may be properly aligned with the time-variant envelope 32 at the transceiver circuit 38. Even so, the time-variant voltage $V_{CC}(t)$ may still be misaligned with the time-variant envelope 32 by the group delay ΔT, which can include the group delay $dT_3$ incurred in the ETIC 44 and/or certain group delay caused by the signal processing circuit 40 (ΔT≥$dT_3$).

Thus, to generate the time-variance voltage $V_{CC}(t)$ that can tolerate the group delay ΔT, a voltage processing circuit 50 is provided in the target voltage circuit 42 to generate the windowed time-variant target voltage $V_{TGT-W}(t)$ based on the group delay ΔT and the time-variant target voltage $V_{TGT}(t)$.

The group delay ΔT may be statically or dynamically determined and provided to the voltage processing circuit 50. In one embodiment, the group delay ΔT may be statically or dynamically determined by the transceiver circuit 38 (e.g., based on pre-configuration, simulation, real-time detection, etc.) and provided to the voltage processing circuit 50. In another embodiment, the target voltage circuit 42 can further include a delay detector circuit 52 to dynamically determine the group delay ΔT. For example, the delay detector circuit 52 can be configured to dynamically detect the group delays $dT_1$, $dT_2$, and $dT_3$ introduced by the envelope detector circuit 46, the analog LUT circuit 48, and the ETIC 44, respectively. Accordingly, the delay detector circuit 52 can dynamically determine the group delay ΔT based on the detected group delays $dT_1$, $dT_2$, and $dT_3$ and provide the determined group delay ΔT to the voltage processing circuit 50.

Figure 3:
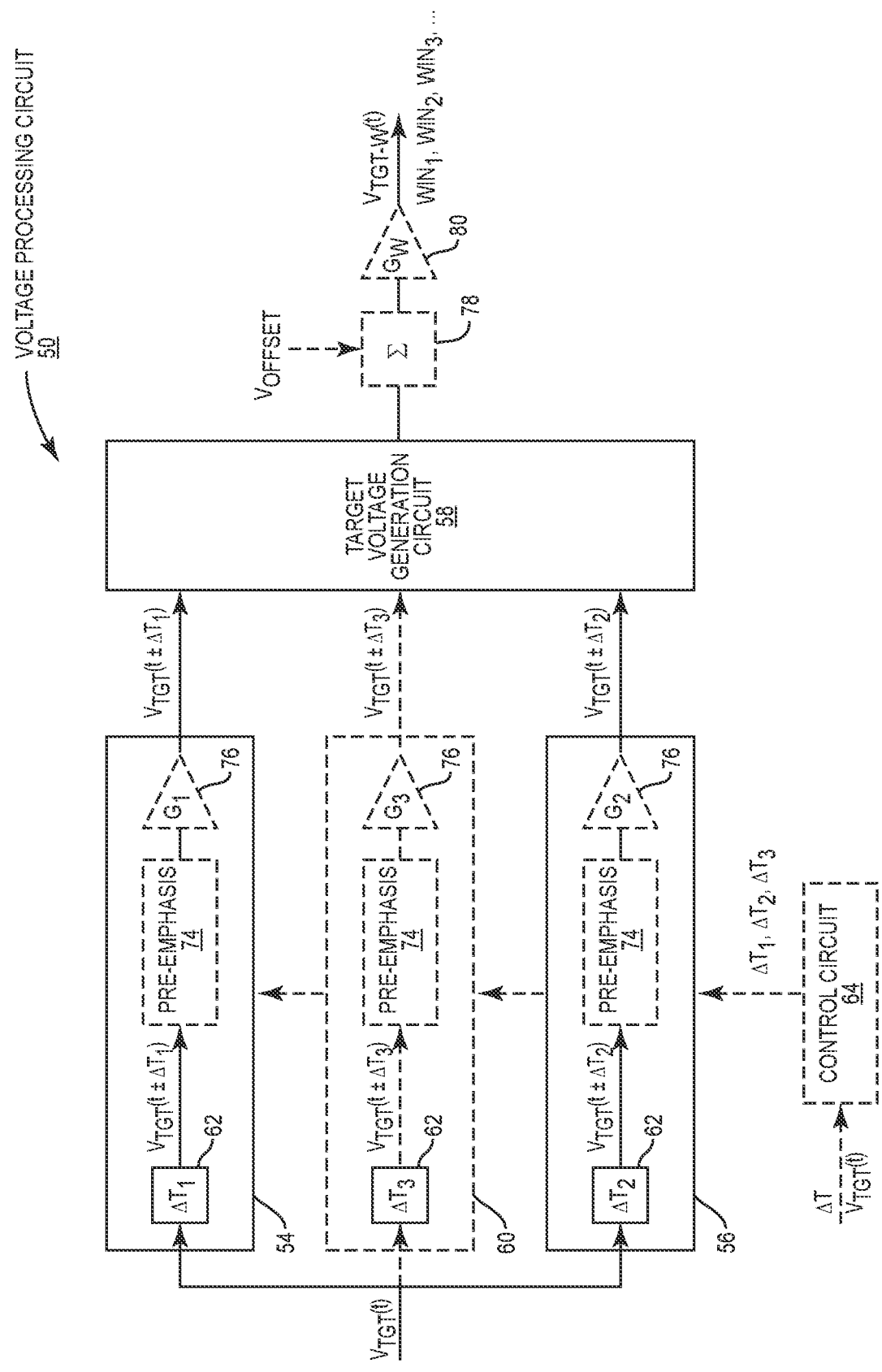
FIG. 3 is a schematic diagram of a voltage processing circuit in the power management circuit of FIG. 2 configured to generate a windowed time-variant target voltage that can cause the power management circuit to generate the time-variant voltage to tolerate the group delay.

FIG. 3 is a schematic diagram of the voltage processing circuit 50 in FIG. 2 configured to generate the windowed time-variant target voltage $V_{TGT-W}(t)$ that can cause the power management circuit 30 to generate the time-variant voltage $V_{CC}(t)$ to tolerate the determined group delay ΔT. Common elements between FIGS. 2 and 3 are shown therein with common element numbers and will not be re-described herein.

The voltage processing circuit 50 can be configured to include a first group delay circuit 54, a second group delay circuit 56, and a target voltage generation circuit 58. The first group delay circuit 54 and the second group delay circuit 56 are each configured to receive the time-variant target voltage $V_{TGT}(t)$. The first group delay circuit 54 is configured to generate a first time-variant target voltage $V_{TGT}(t±ΔT_1)$ having a first group delay $ΔT_1$ relative to the time-variant target voltage $V_{TGT}(t)$. The second group delay circuit 56 is configured to generate a second time-variant target voltage $V_{TGT}(t±ΔT_2)$ having a second group delay $ΔT_2$ relative to the time-variant target voltage $V_{TGT}(t)$.

The first group delay $ΔT_1$ can be a negative group delay $-ΔT_1$ that leads the time-variant target voltage $V_{TGT}(t)$ or a positive group delay $ΔT_1$ that lags behind the time-variant target voltage $V_{TGT}(t)$. Likewise, the second group delay $ΔT_2$ can be a negative group delay $-ΔT_2$ that leads the time-variant target voltage $V_{TGT}(t)$ or a positive group delay $ΔT_2$ that lags behind the time-variant target voltage $V_{TGT}(t)$.

In one example, the first group delay $ΔT_1$ and the second group delay $ΔT_2$ are both positive group delays, meaning that the first time-variant target voltage $V_{TGT}(t+ΔT_1)$ and the second time-variant target voltage $V_{TGT}(t+ΔT_2)$ are both delayed from the time-variant target voltage $V_{TGT}(t)$. In another example, the first group delay $ΔT_1$ and the second group delay $ΔT_2$ are both negative group delays, meaning that the first time-variant target voltage $V_{TGT}(t-ΔT_1)$ and the second time-variant target voltage $V_{TGT}(t-ΔT_2)$ are both ahead of the time-variant target voltage $V_{TGT}(t)$. In yet another example, the first group delay $ΔT_1$ can be a negative group delay and the second group delay $ΔT_2$ can be positive group delays, meaning that the first time-variant target voltage $V_{TGT}(t-ΔT_1)$ is ahead of the time-variant target voltage $V_{TGT}(t)$ and the second time-variant target voltage $V_{TGT}(t+ΔT_2)$ is delayed from the time-variant target voltage $V_{TGT}(t)$.

The target voltage generation circuit 58 is configured to receive the first time-variant target voltage $V_{TGT}(t±ΔT_1)$ and the second time-variant target voltage $V_{TGT}(t±Δ)$. Accordingly, the target voltage generation circuit 58 is configured to generate the windowed time-variant target voltage $V_{TGT-W}(t)$ in a number of group delay tolerance windows $WIN_1$, $WIN_2$, $WIN_3$, and so on.

Figure 4:
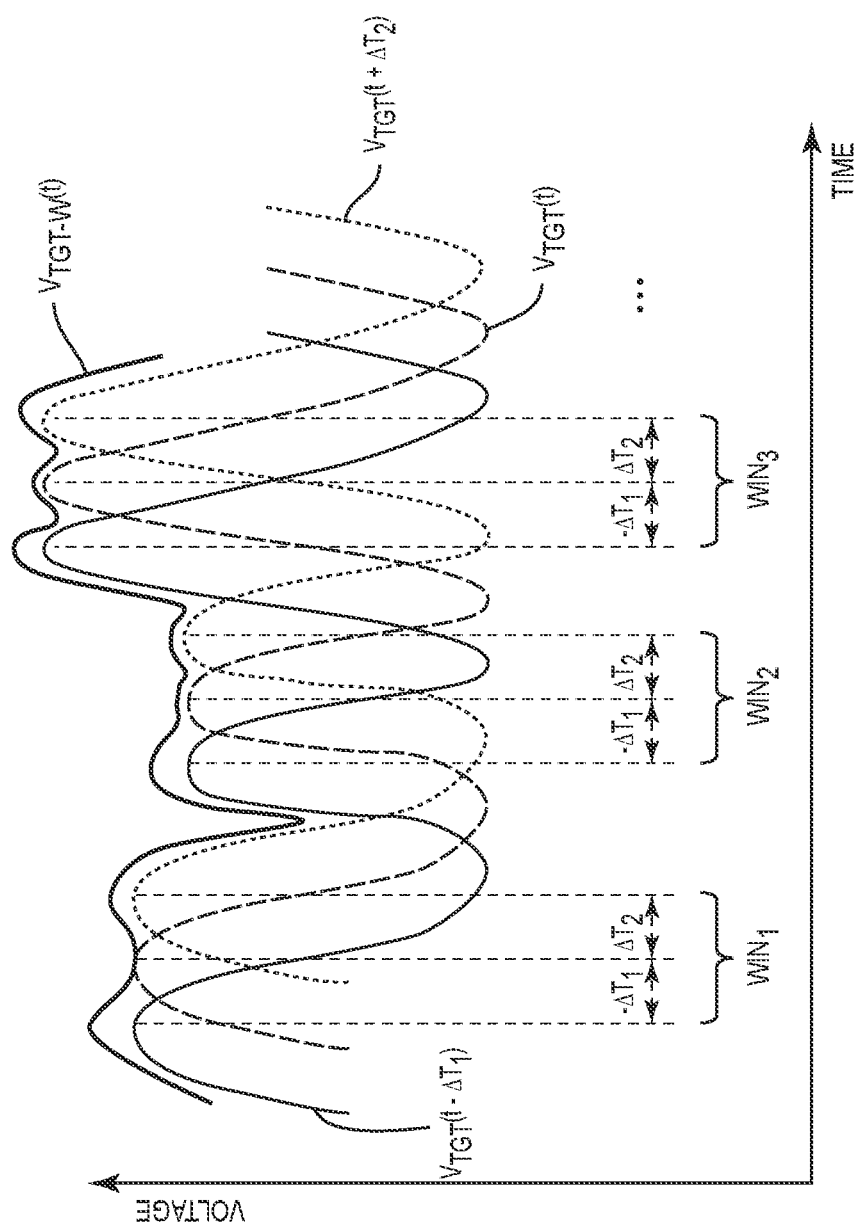
FIG. 4 is a graphic diagram providing an exemplary illustration of the windowed time-variant target voltage produced by the voltage processing circuit of FIG. 3.

In this regard, FIG. 4 is a graphic diagram providing an exemplary illustration of the windowed time-variant target voltage $V_{TGT-W}(t)$ that is produced by the target voltage generation circuit 58 in FIG. 3. Common elements between FIGS. 3 and 4 are shown therein with common element numbers and will not be re-described herein.

FIG. 4 illustrates a first time-variant target voltage $V_{TGT}(t-\Delta T_1)$ having a negative group delay $-\Delta T_1$ and a second time-variant target voltage $V_{TGT}(t+\Delta T_2)$ having a positive group delay $\Delta T_2$. The negative group delay $-\Delta T_1$ and the positive group delay $\Delta T_2$ collectively define the group delay tolerance windows $WIN_1$, $WIN_2$, $WIN_3$, and so on. As illustrated, each of the group delay tolerance windows $WIN_1$, $WIN_2$, and $WIN_3$ has a window size of $|\Delta T_1|+|\Delta T_2|$. In a non-limiting example, each of the group delay tolerance windows $WIN_1$, $WIN_2$, $WIN_3$ can be so determined to coincide with peaks of the first time-variant target voltage $V_{TGT}(t-\Delta T_1)$ and the second time-variant target voltage $V_{TGT}(t+\Delta T_2)$. Inside each of the group delay tolerance windows $WIN_1$, $WIN_2$, and $WIN_3$, the target voltage generation circuit 58 selects a highest one of the first time-variant target voltage $V_{TGT}(t-\Delta T_1)$ and the second time-variant target voltage $V_{TGT}(t+\Delta T_2)$ to output as the windowed time-variant target voltage $V_{TGT-W}(t)$. By outputting the windowed time-variant target voltage $V_{TGT-W}(t)$ based on the highest one of the first time-variant target voltage $V_{TGT}(t-\Delta T_1)$ and the second time-variant target voltage $V_{TGT}(t+\Delta T_2)$, the windowed time-variant target voltage $V_{TGT-W}(t)$ may become more resilient with respect to the group delay $\Delta T$ inside each of the group delay tolerance windows $WIN_1$, $WIN_2$, and $WIN_3$. As a result, the ETIC 44 may be able to generate the time-variant voltage $V_{CC}(t)$ that is more resilient to the group delay $\Delta T$.

Figure 5:
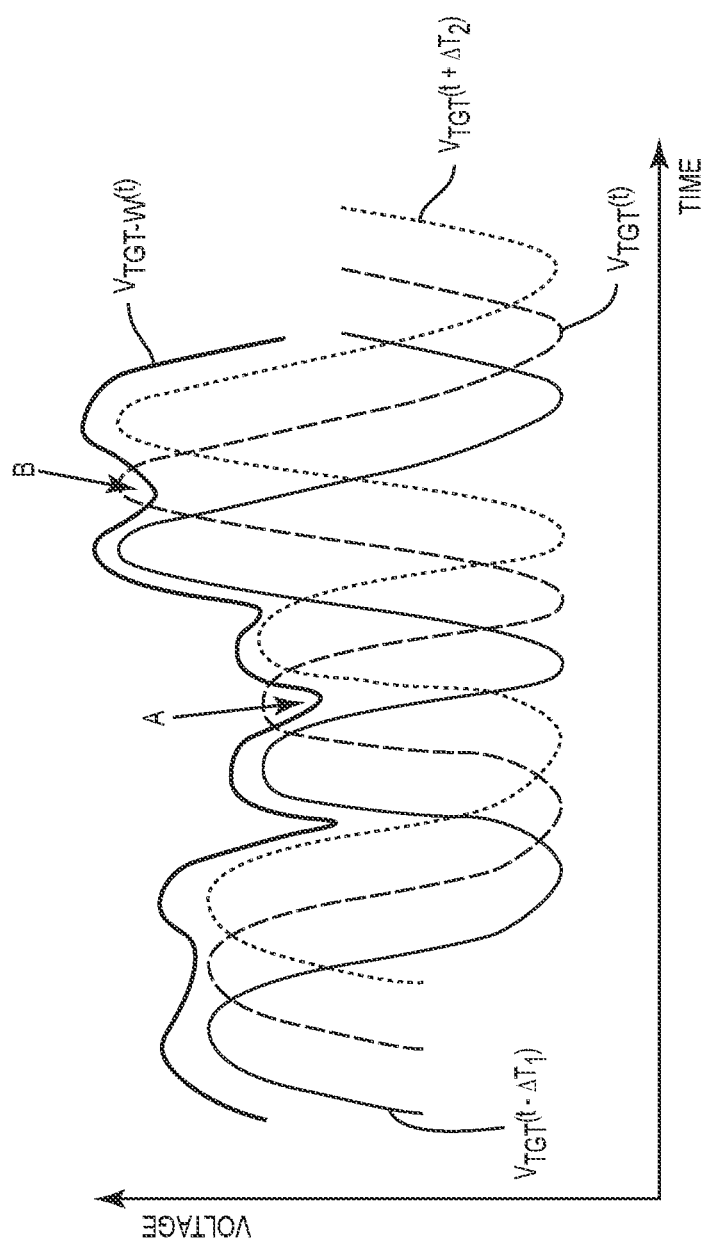
FIG. 5 is a graphic diagram providing an exemplary illustration of a scenario that may require fine tuning to the windowed time-variant target voltage produced by the voltage processing circuit of FIG. 3.

Although the windowed time-variant target voltage $V_{TGT-W}(t)$ is generated based on the highest one of the first time-variant target voltage $V_{TGT}(t-\Delta T_1)$ and the second time-variant target voltage $V_{TGT}(t+\Delta T_2)$, there may be occasions where the windowed time-variant target voltage $V_{TGT-W}(t)$ is still lower than the time-variant target voltage $V_{TGT}(t)$. In this regard, FIG. 5 is a graphic diagram providing an exemplary illustration of a scenario that may require fine tuning to the windowed time-variant target voltage $V_{TGT-W}(t)$ produced by the target voltage generation circuit 58 of FIG. 3. Common elements between FIGS. 3 and 5 are shown therein with common element numbers and will not be re-described herein.

As illustrated in FIG. 5, the windowed time-variant target voltage $V_{TGT-W}(t)$ dips below the time-variant target voltage $V_{TGT}(t)$ at points A and B, which may lead to amplitude clipping to the analog signal 34. As such, it may be necessary to fine tune the windowed time-variant target voltage $V_{TGT-W}(t)$ to make the windowed time-variant target voltage $V_{TGT-W}(t)$ consistently higher than or equal to the time-variant target voltage $V_{TGT}(t)$.

In this regard, with reference back to FIG. 3, the voltage processing circuit 50 can be configured to further include at least one third group delay circuit 60. The third group delay circuit 60 can be configured to generate at least one third time-variant target voltage $V_{TGT}(t\pm\Delta T_3)$ having at least one third group delay $\Delta T_3$ relative to the time-variant target voltage $V_{TGT}(t)$. Like the first group delay $\Delta T_1$ and the second group delay $\Delta T_2$, the third group delay $\Delta T_3$ can be a negative group delay $-\Delta T_3$ that leads the time-variant target voltage $V_{TGT}(t)$ or a positive group delay $\Delta T_3$ that lags behind the time-variant target voltage $V_{TGT}(t)$. In a non-limiting example, the third group delay $\Delta T_3$ can be equal to an average of the first group delay $\Delta T_1$ and the second group delay $\Delta T_2$.

Accordingly, the target voltage generation circuit 58 can be configured to generate the windowed time-variant target voltage $V_{TGT-W}(t)$ to be higher than or equal to a highest one of the first time-variant target voltage $V_{TGT}(t\pm\Delta T_1)$, the second time-variant target voltage $V_{TGT}(t\pm\Delta T_2)$, and the third time-variant target voltage $V_{TGT}(t\pm\Delta T_3)$ in the group delay tolerance windows $WIN_1$, $WIN_2$, $WIN_3$, and so on.

Figure 6:
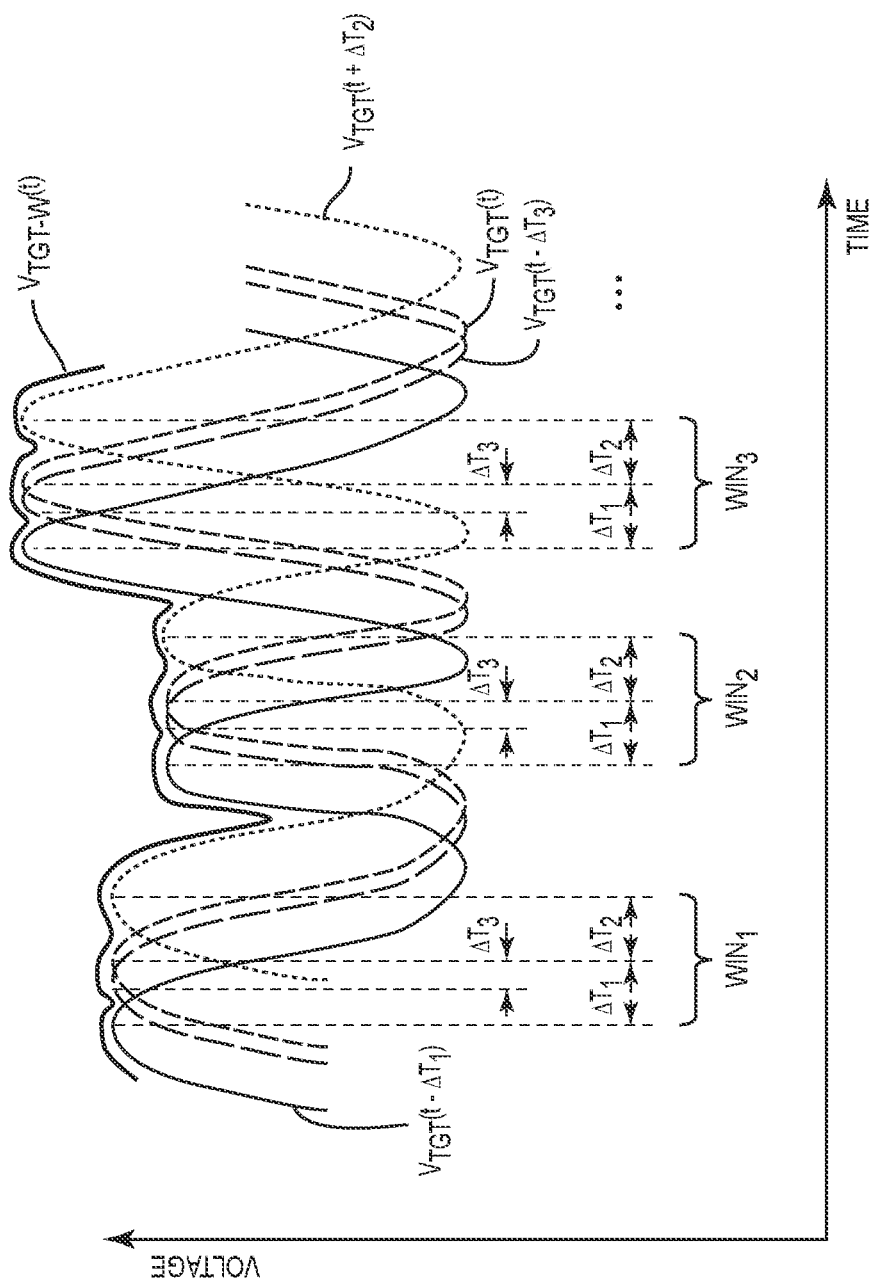
FIG. 6 is a graphic diagram providing an exemplary illustration of the windowed time-variant target voltage after adding a third group delay circuit(s) to the voltage processing circuit of FIG. 3.

Adding the third group delay circuit 60 to the voltage processing circuit 50 not only helps to mitigate the potential amplitude clipping issue as illustrated in FIG. 5, but also helps to smooth out the windowed time-variant target voltage $V_{TGT-W}(t)$. In this regard, FIG. 6 is a graphic diagram providing an exemplary illustration of the windowed time-variant target voltage $V_{TGT-W}(t)$ after adding the third group delay circuit 60 to the voltage processing circuit 50 of FIG. 3. Common elements between FIGS. 3 and 6 are shown therein with common element numbers and will not be re-described herein.

As illustrated in FIG. 6, after adding the third group delay circuit 60 to the voltage processing circuit 50, the windowed time-variant target voltage $V_{TGT-W}(t)$ remains consistently higher than or equal to the time-variant target voltage $V_{TGT}(t)$ to help avoid potential amplitude clipping to the analog signal 34. In addition, the windowed time-variant target voltage $V_{TGT-W}(t)$ also becomes smoother compared to the windowed time-variant target voltage $V_{TGT-W}(t)$ shown in FIG. 4. As a result, it helps to reduce fluctuation in the time-variant voltage $V_{CC}(t)$.

With reference back to FIG. 3, each of the first group delay circuit 54, the second group delay circuit 56, and the third group delay circuit 60 can include a respective group delay circuit 62. The group delay circuit 62 is configured to generate a respective one of the first time-variant target voltage $V_{TGT}(t\pm\Delta T_1)$, the second time-variant target voltage $V_{TGT}(t\pm\Delta T_2)$, and the third time-variant target voltage $V_{TGT}(t\pm\Delta T_3)$ having a respective one of the first group delay $\Delta T_1$, the second group delay $\Delta T_2$, and the third group delay $\Delta T_3$ relative the time-variant target voltage $V_{TGT}(t)$.

The voltage processing circuit 50 may include a control circuit 64, such as a field-programmable gate array (FPGA), as an example. The control circuit 64 can be configured to receive the determined group delay $\Delta T$ from either the analog LUT circuit 48 or the transceiver circuit 38 in FIG. 2. Accordingly, the control circuit 64 can determine the first group delay $\Delta T_1$, the second group delay $\Delta T_2$, and/or the third group delay $\Delta T_3$ for the first group delay circuit 54, the second group delay circuit 56, and/or the third group delay circuit 60.

As mentioned earlier, any of the first group delay $\Delta T_1$, the second group delay $\Delta T_2$, and the third group delay $\Delta T_3$ can be a negative group delay or a positive group delay. Accordingly, the group delay circuit 62 in any of the first group delay circuit 54, the second group delay circuit 56, and the third group delay circuit 60 can be a negative group delay circuit or a positive group delay circuit.

In an embodiment, the negative group delay circuit can be an inverted negative group delay circuit, as described in detail in U.S. patent application Ser. No. 17/363,522, entitled "INVERTED GROUP DELAY CIRCUIT." Notably, the negative group delay circuit may also be implemented as a non-inverted negative group delay circuit.

Figure 7A:
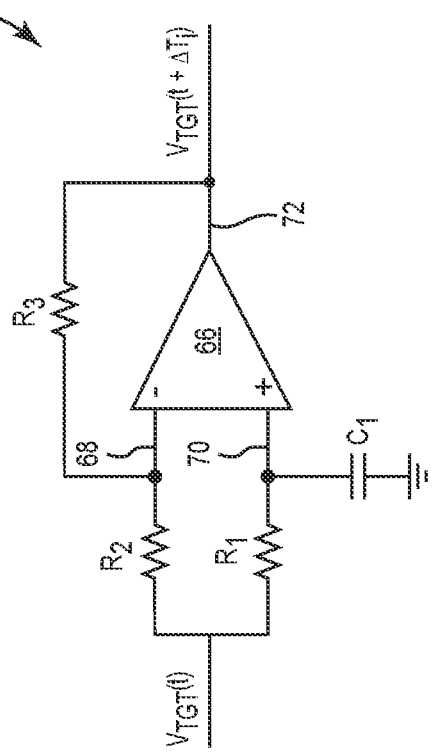
FIGS. 7A and 7B are schematic diagrams of exemplary positive group delay circuits that can be provided in the voltage processing circuit of FIG. 3 to introduce a positive delay for generating the windowed time-variant target voltage.
Figure 7B:
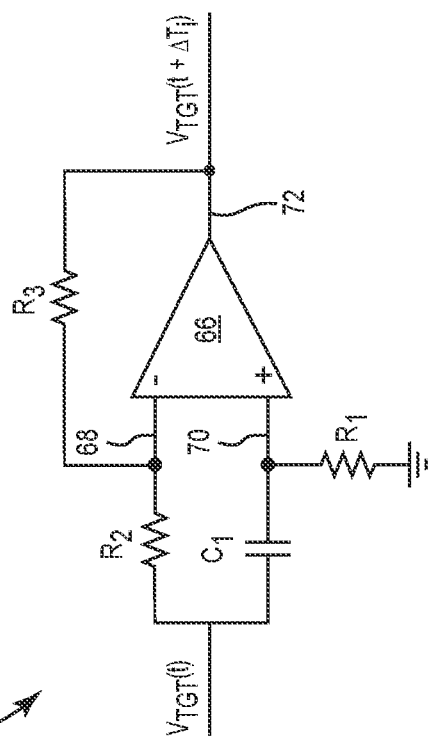

In an embodiment, the positive group delay circuit can be implemented based on all-pass networks. In this regard, FIGS. 7A and 7B are schematic diagrams of exemplary positive group delay circuits 65A and 65B that can be provided as the group delay circuit 62 in the voltage processing circuit 50 of FIG. 3. Common elements between FIGS. 3 and 7A-7B are shown therein with common element numbers and will not be re-described herein.

With reference to FIG. 7A, the positive group delay circuit 65A includes an operational amplifier 66 having an inverting terminal 68, a non-inverting terminal 70, and an output terminal 72. The inverting terminal 68 and the non-inverting terminal 70 are configured to receive the time-variant target voltage $V_{TGT}(t)$. The output terminal 72 outputs a delayed time-variant target voltage $V_{TGT}(t+\Delta T_i)$ (i=1, 2, 3, ... ), which can be any of the first time-variant target voltage $V_{TGT}(t+\Delta T_1)$, the second time-variant target voltage $V_{TGT}(t+\Delta T_2)$, and the third time-variant target voltage $V_{TGT}(t+\Delta T_3)$.

With reference to FIG. 7B, the positive group delay circuit 65B also includes the operational amplifier 66 having the inverting terminal 68, the non-inverting terminal 70, and the output terminal 72. The inverting terminal 68 and the non-inverting terminal 70 are configured to receive the time-variant target voltage $V_{TGT}(t)$. The output terminal 72 outputs a delayed time-variant target voltage $V_{TGT}(t+\Delta T_i)$ (i=1, 2, 3, ... ), which can be any of the first time-variant target voltage $V_{TGT}(t+\Delta T_1)$, the second time-variant target voltage $V_{TGT}(t+\Delta T_2)$, and the third time-variant target voltage $V_{TGT}(t+\Delta T_3)$.

The positive group delay circuit 65A of FIG. 7A and the positive group delay circuit 65B of FIG. 7B each has a transfer function H(s) as shown in equation (Eq. 1) below.

$$H(s) = [s - R_3/(R_2 * R_1 * C_1)]/[s + 1/(R_1 * C_1)] \qquad (Eq.\ 1)$$

In the equation (Eq. 1) above, s represents a Laplace notation that defines a frequency characteristic of a filter or a network. Notably, when $R_2$ is equal to $R_3$ ($R_2 = R_3$), the transfer function H(s) of the positive group delay circuit 65A and the positive group delay circuit 65B becomes an all-pass function.

With reference back to FIG. 3, when the group delay circuit 62 in any of the first group delay circuit 54, the second group delay circuit 56, and the third group delay circuit 60 is the positive group delay circuit 65A in FIG. 7A or the positive group delay circuit 65B in FIG. 7B, it is possible to introduce pre-emphasis as a function of $R_3/R_2$ ($R_2 \neq R_3$) in accordance with the equation (Eq. 1) above. This is equivalent to adding a respective pre-emphasis circuit 74 in any of the first group delay circuit 54, the second group delay circuit 56, and the third group delay circuit 60 where the respective group delay circuit 62 is the positive group delay circuit. To help keep the positive group delay $\Delta T_i$ (i=1, 2, 3, ... ) constant, it is also possible to change $C_1$ by a factor of $2/(1+R_3/R_2)$.

Each of the first group delay circuit 54, the second group delay circuit 56, and the third group delay circuit 60 may be configured to include a respective nonlinear amplifier 76 (denoted as "$G_1$," "$G_2$," and "$G_3$") coupled in tandem with the respective group delay circuit 62. The nonlinear amplifier 76 may be configured to introduce a nonlinear gain in a respective one of the first time-variant target voltage $V_{TGT}(t \pm \Delta T_1)$, the second time-variant target voltage $V_{TGT}(t \pm \Delta T_2)$, and the third time-variant target voltage $V_{TGT}(t \pm \Delta T_3)$.

The voltage processing circuit 50 may also be configured to include an offset circuit 78, which is coupled to the target voltage generation circuit 58. The offset circuit 78 may be configured to apply a direct current (DC) voltage $V_{OFFSET}$ to the windowed time-variant target voltage $V_{TGT-W}(t)$. The DC voltage $V_{OFFSET}$ can be a positive voltage that causes the windowed time-variant target voltage $V_{TGT-W}(t)$ to increase or a negative voltage that causes the windowed time-variant target voltage $V_{TGT-W}(t)$ to decrease. In a non-limiting example, the DC voltage $V_{OFFSET}$ can be applied to increase the windowed time-variant target voltage $V_{TGT-W}(t)$ above the time-variant target voltage $V_{TGT}(t)$ at points A and B in FIG. 5.

The voltage processing circuit 50 may further include a target voltage amplifier 80. The target voltage amplifier 80 may be configured to amplify the windowed time-variant target voltage $V_{TGT-W}(t)$. In a non-limiting example, the target voltage amplifier 80 can be used to increase the windowed time-variant target voltage $V_{TGT-W}(t)$ above the time-variant target voltage $V_{TGT}(t)$ at points A and B in FIG. 5.

Notably, the group delay circuit 62, the pre-emphasis circuit 74, the nonlinear amplifier 76, the offset circuit 78, and the target voltage amplifier 80 may be used independently or concurrently. In a non-limiting example, the control circuit 64 can be configured to control any one or more of the group delay circuit 62, the pre-emphasis circuit 74, the nonlinear amplifier 76, the offset circuit 78, and the target voltage amplifier 80 based on the determined group delay $\Delta T$ and/or the time-variant target voltage $V_{TGT}(t)$.

Figure 8A:
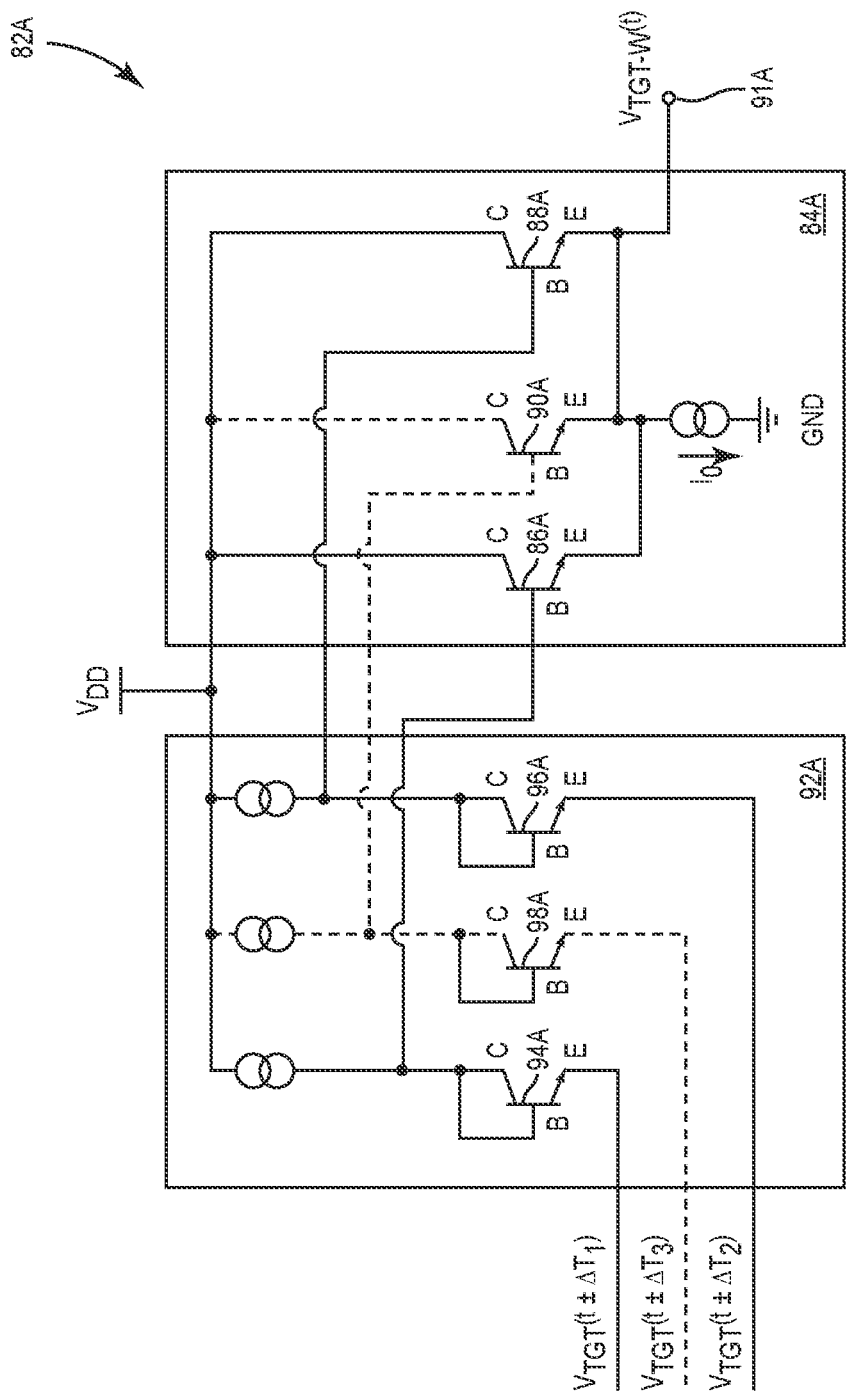
FIGS. 8A and 8B are schematic diagrams of exemplary maximum signal selector circuits that can be provided in the voltage processing circuit of FIG. 3 to generate the windowed time-variant target voltage.
Figure 8B:
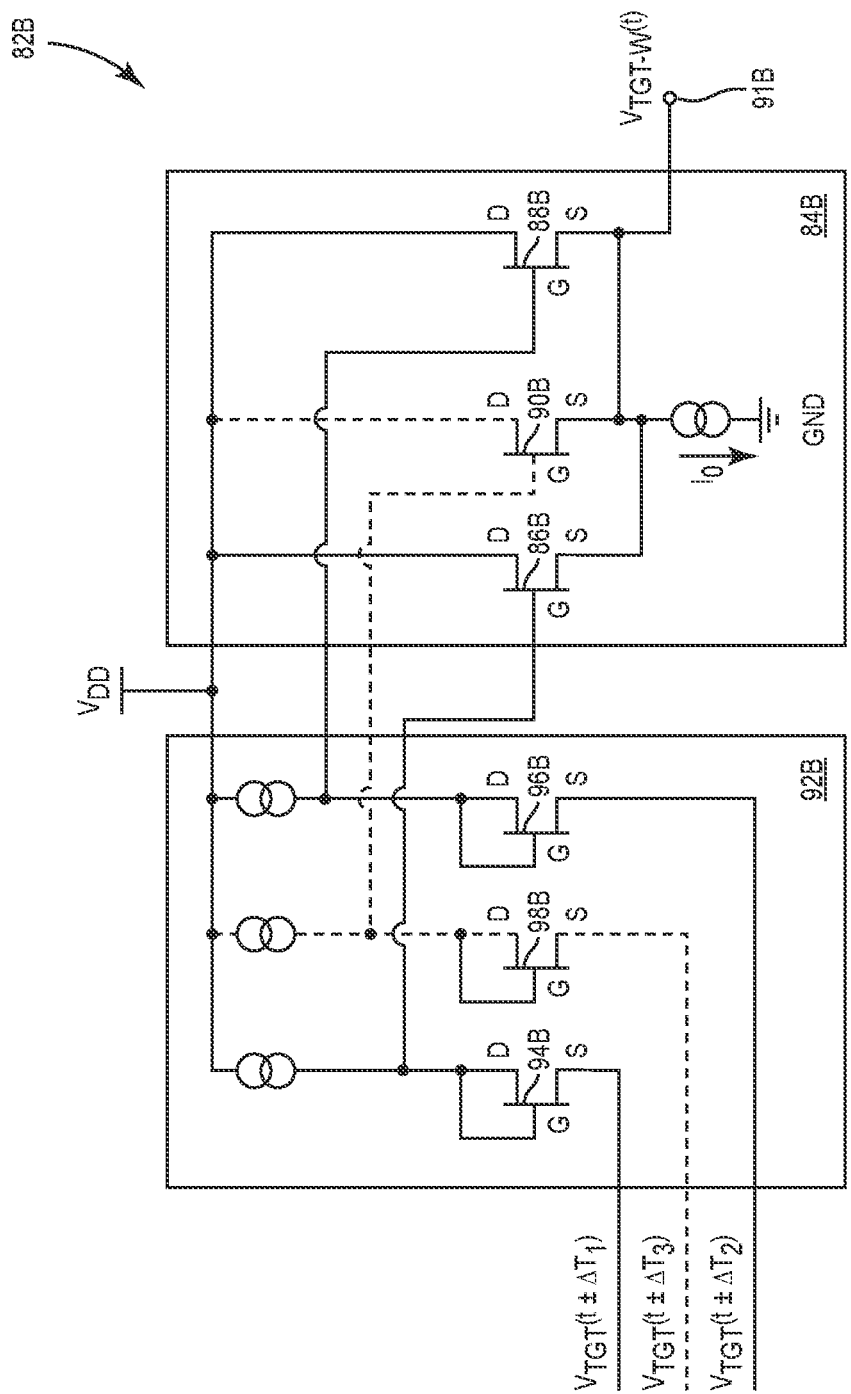

As mentioned earlier, the target voltage generation circuit 58 can be configured to generate the windowed time-variant target voltage $V_{TGT-W}(t)$ to be higher than or equal to a highest one of the first time-variant target voltage $V_{TGT}(t \pm \Delta T_1)$, the second time-variant target voltage $V_{TGT}(t \pm \Delta T_2)$, and the third time-variant target voltage $V_{TGT}(t \pm \Delta T_3)$ in each of the group delay tolerance windows $WIN_1$, $WIN_2$, and $WIN_3$. In this regard, FIGS. 8A and 8B are schematic diagrams of exemplary maximum signal detector circuits 82A and 82B that can be used as the target voltage generation circuit 58 in the voltage processing circuit 50 of FIG. 3 to generate the windowed time-variant target voltage $V_{TGT-W}(t)$. Common elements between FIGS. 3 and 8A-8B are shown therein with common element numbers and will not be re-described herein.

With reference to FIG. 8A, the maximum signal detector circuit 82A includes a signal selector circuit 84A. In one embodiment, the signal selector circuit 84A is configured to generate the windowed time-variant target voltage $V_{TGT-W}(t)$ based on the first time-variant target voltage $V_{TGT}(t \pm \Delta T_1)$ and the second time-variant target voltage $V_{TGT}(t \pm \Delta T_2)$. In this regard, the signal selector circuit 84A includes a first core transistor 86A and a second core transistor 88A. In another embodiment, the signal selector circuit 84A is configured to generate the windowed time-variant target voltage $V_{TGT-W}(t)$ based on the first time-variant target voltage $V_{TGT}(t \pm \Delta T_1)$, the second time-variant target voltage $V_{TGT}(t \pm \Delta T_2)$, and the third time-variant target voltage $V_{TGT}(t \pm \Delta T_3)$. In this regard, the signal selector circuit 84A further includes a third core transistor 90A.

In an embodiment disclosed herein, the first core transistor 86A, the second core transistor 88A, and the third core transistor 90A are bipolar transistors that are identical to each other. In this regard, each of the first core transistor 86A, the second core transistor 88A, and the third core transistor 90A includes a respective collector terminal C coupled to a supply voltage $V_{DD}$, which may be provided by a battery voltage or a voltage from a low-dropout (LDO). Each of the first core transistor 86A, the second core transistor 88A, and the third core transistor 90A also includes a respective emitter terminal E coupled to a ground (GND) and a signal output 91A. Each of the first core transistor 86A, the second core transistor 88A, and the third core transistor 90A further includes a respective base terminal B (a.k.a. signal input) configured to receive a respective one of the first time-variant target voltage $V_{TGT}(t \pm \Delta T_1)$, the second time-variant target voltage $V_{TGT}(t \pm \Delta T_2)$, and the third time-variant target voltage $V_{TGT}(t \pm \Delta T_3)$. Accordingly, the signal selector circuit 84A is configured to output the windowed time-variant target voltage $V_{TGT-W}(t)$ via the signal output 91A as the highest one of the first time-variant target voltage $V_{TGT}(t\pm\Delta T_1)$, the second time-variant target voltage $V_{TGT}(t\pm\Delta T_2)$, and the third time-variant target voltage $V_{TGT}(t\pm\Delta T_3)$.

In a non-limiting example, when the signal selector circuit 84A is configured to output the windowed time-variant target voltage $V_{TGT-W}(t)$ as the highest one of the first time-variant target voltage $V_{TGT}(t\pm\Delta T_1)$ and the second time-variant target voltage $V_{TGT}(t\pm\Delta T_2)$, the windowed time-variant target voltage $V_{TGT-W}(t)$ can be expressed in equation (Eq. 2) below.

$$V_{TGT-W}(t) = V_{TGT}(t\pm\Delta T_1) + VT*\ln\left(1+e^{\frac{V_{TGT}(t\pm\Delta T_2)-V_{TGT}(t\pm\Delta T_1)}{VT}}\right) \quad (\text{Eq. 2})$$

In the equation (Eq. 2) above, VT represents a thermal voltage, which may be approximately 26 mV/C° at an absolute temperature (T)=300 Kevin (K). Notably, the signal selector circuit 84A differs from a conventional bipolar wire-OR logic gate in that the signal selector circuit 84A is driven by analog inputs, such as the first time-variant target voltage $V_{TGT}(t\pm\Delta T_1)$, the second time-variant target voltage $V_{TGT}(t\pm\Delta T_2)$, and the third time-variant target voltage $V_{TGT}(t\pm\Delta T_3)$. This is different from the conventional bipolar wire-OR logic gate, which is driven by inputs of logic levels.

The maximum signal detector circuit 82A may also include a level shift circuit 92A. In one embodiment, the level shift circuit 92A includes a first level shift transistor 94A and a second level shift transistor 96A. In another embodiment, the level shift circuit 92A may further include a third level shift transistor 98A.

In an embodiment disclosed herein, the first level shift transistor 94A, the second level shift transistor 96A, and the third level shift transistor 98A are bipolar transistors that are identical to each other. In this regard, each of the first level shift transistor 94A, the second level shift transistor 96A, and the third level shift transistor 98A includes a respective collector terminal C coupled to the supply voltage $V_{DD}$ and the base electrode B of a respective one of the first core transistor 86A, the second core transistor 88A, and the third core transistor 90A. Each of the first level shift transistor 94A, the second level shift transistor 96A, and the third level shift transistor 98A also includes a respective emitter terminal E configured to receive a respective one of the first time-variant target voltage $V_{TGT}(t\pm\Delta T_1)$, the second time-variant target voltage $V_{TGT}(t\pm\Delta T_2)$, and the third time-variant target voltage $V_{TGT}(t\pm\Delta T_3)$. Each of the first level shift transistor 94A, the second level shift transistor 96A, and the third level shift transistor 98A further includes a respective base terminal B coupled to the respective collector terminal C.

With reference to FIG. 8B, the maximum signal detector circuit 82B includes a signal selector circuit 84B. In one embodiment, the signal selector circuit 84B is configured to generate the windowed time-variant target voltage $V_{TGT-W}(t)$ based on the first time-variant target voltage $V_{TGT}(t\pm\Delta T_1)$ and the second time-variant target voltage $V_{TGT}(t\pm\Delta T_2)$. In this regard, the signal selector circuit 84B includes a first core transistor 86B and a second core transistor 88B. In another embodiment, the signal selector circuit 84B is configured to generate the windowed time-variant target voltage $V_{TGT-W}(t)$ based on the first time-variant target voltage $V_{TGT}(t\pm\Delta T_1)$, the second time-variant target voltage $V_{TGT}(t\pm\Delta T_2)$, and the third time-variant target voltage $V_{TGT}(t\pm\Delta T_3)$. In this regard, the signal selector circuit 84B further includes a third core transistor 90B.

In an embodiment disclosed herein, the first core transistor 86B, the second core transistor 88B, and the third core transistor 90B are field-effect transistors (FETs) that are identical to each other. In this regard, each of the first core transistor 86B, the second core transistor 88B, and the third core transistor 90B includes a respective drain terminal D coupled to the supply voltage $V_{DD}$. Each of the first core transistor 86B, the second core transistor 88B, and the third core transistor 90B also includes a respective source terminal S coupled to the GND and a signal output 91B. Each of the first core transistor 86B, the second core transistor 88B, and the third core transistor 90B further includes a respective gate terminal G (a.k.a. signal input) configured to receive a respective one of the first time-variant target voltage $V_{TGT}(t\pm\Delta T_1)$, the second time-variant target voltage $V_{TGT}(t\pm\Delta T_2)$, and the third time-variant target voltage $V_{TGT}(t\pm\Delta T_3)$. Accordingly, the signal selector circuit 84A is configured to output the windowed time-variant target voltage $V_{TGT-W}(t)$ via the signal output 91B as the highest one of the first time-variant target voltage $V_{TGT}(t\pm\Delta T_1)$, the second time-variant target voltage $V_{TGT}(t\pm\Delta T_2)$, and the third time-variant target voltage $V_{TGT}(t\pm\Delta T_3)$.

The maximum signal detector circuit 82B may also include a level shift circuit 92B. In one embodiment, the level shift circuit 92B includes a first level shift transistor 94B and a second level shift transistor 96B. In another embodiment, the level shift circuit 92B may further include a third level shift transistor 98B.

In an embodiment disclosed herein, the first level shift transistor 94B, the second level shift transistor 96B, and the third level shift transistor 98B are FETs that are identical to each other. In this regard, each of the first level shift transistor 94B, the second level shift transistor 96B, and the third level shift transistor 98B includes a respective drain terminal D coupled to the supply voltage $V_{DD}$ and the gate electrode G of a respective one of the first core transistor 86B, the second core transistor 88B, and the third core transistor 90B. Each of the first level shift transistor 94B, the second level shift transistor 96B, and the third level shift transistor 98B also includes a respective source terminal S configured to receive a respective one of the first time-variant target voltage $V_{TGT}(t\pm\Delta T_1)$, the second time-variant target voltage $V_{TGT}(t\pm\Delta T_2)$, and the third time-variant target voltage $V_{TGT}(t\pm\Delta T_3)$. Each of the first level shift transistor 94B, the second level shift transistor 96B, and the third level shift transistor 98B further includes a respective gate terminal G coupled to the respective drain terminal D.

Those skilled in the art will recognize improvements and modifications to the embodiments of the present disclosure. All such improvements and modifications are considered within the scope of the concepts disclosed herein and the claims that follow.

What is claimed is:

1. A maximum signal detector circuit comprising:
   a signal selector circuit comprising:
      a plurality of signal inputs each configured to receive a respective one of a plurality of analog inputs, wherein each of the plurality of analog inputs comprises a respective group delay relative to a time-variant target voltage; and
      a signal output configured to output a highest one of the plurality of analog inputs in a plurality of group delay tolerance windows each having a duration that is equal to an absolute value of a first group delay plus an absolute value of a second group delay.

2. The maximum signal detector circuit of claim 1, wherein the signal selector circuit comprises a plurality of core transistors each coupled between a respective one of the plurality of signal inputs and the signal output.

3. The maximum signal detector circuit of claim 2 further comprising a level shift circuit comprising a plurality of level shift transistors each coupled to a respective one of the plurality of core transistors.

4. The maximum signal detector circuit of claim 3, wherein each of the plurality of core transistors is a bipolar transistor comprising:
   a base terminal operable as a respective one of the plurality of signal inputs to receive the respective one of the plurality of analog inputs;
   a collector terminal coupled to a supply voltage; and
   an emitter terminal coupled to the signal output to output the highest one of the plurality of analog inputs.

5. The maximum signal detector circuit of claim 4, wherein each of the plurality of level shift transistors is a bipolar level shift transistor comprising:
   a respective emitter terminal configured to receive the respective one of the plurality of analog inputs;
   a respective collector terminal coupled to the base terminal of a respective one of the plurality of core transistors; and
   a respective base terminal coupled to the respective collector terminal.

6. The maximum signal detector circuit of claim 3, wherein each of the plurality of core transistors is a field-effect transistor (FET) comprising:
   a gate terminal operable as a respective one of the plurality of signal inputs to receive the respective one of the plurality of analog inputs;
   a drain terminal coupled to a supply voltage; and
   a source terminal coupled to the signal output to output the highest one of the plurality of analog inputs.

7. The maximum signal detector circuit of claim 6, wherein each of the plurality of level shift transistors is a level shift FET comprising:
   a respective source terminal configured to receive the respective one of the plurality of analog inputs;
   a respective drain terminal coupled to the gate terminal of a respective one of the plurality of core transistors; and
   a respective gate terminal coupled to the respective drain terminal.

8. A voltage processing circuit comprising:
   a first group delay circuit configured to receive a time-variant target voltage and generate a first time-variant target voltage having a first group delay relative to the time-variant target voltage;
   a second group delay circuit configured to receive the time-variant target voltage and generate a second time-variant target voltage having a second group delay relative to the time-variant target voltage; and
   a maximum signal detector circuit comprising:
     a signal selector circuit comprising:
       a plurality of signal inputs configured to receive the first time-variant target voltage and the second time-variant target voltage; and
       a signal output configured to generate a windowed time-variant target voltage higher than or equal to a highest one of the first time-variant target voltage and the second time-variant target voltage in a plurality of group delay tolerance windows each having a duration that is equal to an absolute value of the first group delay plus an absolute value of the second group delay.

9. The voltage processing circuit of claim 8, wherein the signal selector circuit comprises a plurality of core transistors each coupled between a respective one of the plurality of signal inputs and the signal output.

10. The voltage processing circuit of claim 9 wherein the maximum signal detector circuit further comprises a level shift circuit comprising a plurality of level shift transistors each coupled to a respective one of the plurality of core transistors.

11. The voltage processing circuit of claim 8, wherein each of the first group delay and the second group delay is one of a positive group delay and a negative group delay.

12. The voltage processing circuit of claim 8, further comprising a control circuit configured to:
   receive a determined group delay; and
   determine at least the first group delay and the second group delay based on the determined group delay.

13. The voltage processing circuit of claim 8, further comprising at least one third group delay circuit configured to generate at least one third time-variant target voltage having at least one third group delay relative to the time-variant target voltage, wherein the maximum signal detector circuit is further configured to generate the windowed time-variant target voltage higher than or equal to a highest one of the first time-variant target voltage, the second time-variant target voltage, and the at least one third time-variant target voltage in the plurality of group delay tolerance windows.

14. The voltage processing circuit of claim 13 wherein the at least one third group delay is equal to an average of the first group delay and the second group delay.

15. The voltage processing circuit of claim 13, wherein the first group delay circuit, the second group delay circuit, and the at least one third group delay circuit each comprises a respective group delay circuit configured to generate a respective one of the first time-variant target voltage, the second time-variant target voltage, and the at least one third time-variant target voltage having a respective one of the first group delay, the second group delay, and the at least one third group delay relative to the time-variant target voltage.

16. The voltage processing circuit of claim 15, wherein the respective group delay circuit in any of the first group delay circuit, the second group delay circuit, and the at least one third group delay circuit comprises a negative group delay circuit configured to generate a respective one of the first time-variant target voltage, the second time-variant target voltage, and the at least one third time-variant target voltage having a negative group delay relative to the time-variant target voltage.

17. The voltage processing circuit of claim 16, wherein the negative group delay circuit comprises an inverted negative group delay circuit.

18. The voltage processing circuit of claim 15, wherein the respective group delay circuit in any of the first group delay circuit, the second group delay circuit, and the at least one third group delay circuit comprises a positive group delay circuit configured to generate a respective one of the first time-variant target voltage, the second time-variant target voltage, and the at least one third time-variant target voltage having a positive group delay relative to the time-variant target voltage.

19. The voltage processing circuit of claim 18, wherein the positive group delay circuit is coupled to a pre-emphasis circuit configured to keep the positive group delay constant in the respective one of the first time-variant target voltage, the second time-variant target voltage, and the at least one third time-variant target voltage having the positive group delay relative to the time-variant target voltage.

20. The voltage processing circuit of claim 15, wherein the first group delay circuit, the second group delay circuit, and the at least one third group delay circuit each comprises a respective nonlinear amplifier configured to introduce a nonlinear gain in a respective one of the first time-variant target voltage, the second time-variant target voltage, and the at least one third time-variant target voltage.

* * * * *